(12) United States Patent
Satake et al.

(10) Patent No.: US 7,485,189 B2
(45) Date of Patent: Feb. 3, 2009

(54) THIN FILM DEPOSITION DEVICE USING AN FTIR GAS ANALYZER FOR MIXED GAS SUPPLY

(75) Inventors: Tsukasa Satake, Kyoto (JP); Koji Tominaga, Kyoto (JP); Hiroshi Funakubo, Kawasaki (JP)

(73) Assignee: Horiba, Ltd., Kyoto (JP)

( * ) Notice: Subject to any disclaimer, the term of this patent is extended or adjusted under 35 U.S.C. 154(b) by 956 days.

(21) Appl. No.: 09/793,209

(22) Filed: Feb. 26, 2001

(65) Prior Publication Data

US 2002/0022087 A1    Feb. 21, 2002

(30) Foreign Application Priority Data

Feb. 28, 2000 (JP) .............................. 2000-051823

(51) Int. Cl.
*C23C 16/455* (2006.01)
*C23C 16/52* (2006.01)
*C23F 1/00* (2006.01)
*H01L 21/306* (2006.01)
*C23C 16/06* (2006.01)
*C23C 16/40* (2006.01)

(52) U.S. Cl. .................... 118/689; 118/688; 118/690; 118/691; 118/726; 156/345.24; 156/345.25; 156/345.26

(58) Field of Classification Search .............. 118/708, 118/712, 688, 689–692, 715, 663, 696, 697, 118/713, 728, 50, 726; 427/8–10; 156/345.29, 156/345.33–345.36, 345.26, 345.51, 345.24
See application file for complete search history.

(56) References Cited

U.S. PATENT DOCUMENTS 4,795,253 A * 1/1989 Sandridge et al. ............. 356/51

(Continued)

FOREIGN PATENT DOCUMENTS

EP            307995         3/1989

(Continued)

OTHER PUBLICATIONS

Low Temperature CVD of Tin from TI (NR2)4 and NH3: FTIR Studies of the Gas-Phase Chemical Reactions, by B.H. Weiller. Materials Research Society Symposium Proceedings, 1994.

(Continued)

*Primary Examiner*—Rudy Zervigon

(57) ABSTRACT

This invention provides a thin film deposition process making it possible to form a thin film having a desired composition with good reproducibility and high efficiency; a thin film deposition device therefore; a FTIR gas analyzer used in the thin film deposition process; and a mixed gas supplying device used in the thin film deposition process. The thin film deposition process comprises the steps of mixing a plurality of organic metal gases in a gas mixing chamber and supplying the mixed gas into a reaction chamber to deposit a thin film on a substrate positioned in the reaction chamber, wherein the mixture ratio between/among the organic metal gases supplied into the gas mixing chamber is measured with a FTIR gas analyzer fitted to either the gas mixing chamber or the reaction chamber and then on the basis of results of the measurement, the flow rates of the organic metal gases are individually adjusted.

17 Claims, 7 Drawing Sheets

U.S. PATENT DOCUMENTS

| | | | | |
|---|---|---|---|---|
| 5,067,762 | A | * | 11/1991 | Akashi .................... 294/64.3 |
| 5,190,913 | A | * | 3/1993 | Higashiyama et al. ...... 118/690 |
| 5,431,734 | A | * | 7/1995 | Chapple-Sokol et al. .... 118/712 |
| 5,492,718 | A | | 2/1996 | O'Neill et al. |
| 5,540,777 | A | * | 7/1996 | Barbee et al. ............... 118/667 |
| 5,648,113 | A | * | 7/1997 | Barbee et al. .................. 427/8 |
| 5,652,431 | A | * | 7/1997 | DeSisto et al. .............. 250/373 |
| 5,665,608 | A | | 9/1997 | Chapple-Sokol et al. |
| 5,810,928 | A | * | 9/1998 | Harada et al. ............... 118/690 |
| 5,820,678 | A | * | 10/1998 | Hubert et al. ............... 118/690 |
| 5,838,008 | A | * | 11/1998 | Esler et al. ............. 250/339.08 |
| 5,976,257 | A | * | 11/1999 | Kanai et al. ................. 118/718 |
| 6,217,659 | B1 | * | 4/2001 | Botelho et al. .............. 118/715 |

FOREIGN PATENT DOCUMENTS

| | | |
|---|---|---|
| JP | 2025569 | 1/1990 |
| JP | 04-354131 | 12/1992 |
| JP | 5144801 | 6/1993 |
| JP | 7054153 | 2/1995 |

OTHER PUBLICATIONS

"Photo-Enhanced Boron-Doping in Low Temperature Silicon Epitaxy and its FTIR Study," by Watanabe et al., International Conference on Solid State Devices and Materials, IEEE, vol. CONF. 20, Aug. 24, 1988, pp. 117-120.

"In situ real time diagnostics of OMVPE using IR diode laser spectroscopy," by Butler et al., Journal of Crystal Growth, vol. 77, No. 1-3, Sep. 1986, pp. 163-171.

* cited by examiner

THIN FILM DEPOSITION DEVICE USING AN FTIR GAS ANALYZER FOR MIXED GAS SUPPLY

BACKGROUND OF THE INVENTION

1. Field of the Invention

The present invention relates to a thin film deposition process based on chemical vapor deposition using, as raw materials, organic metals, for example, PZT ferroelectrics, PLZT ferroelectrics, BaSr ferroelectrics, Cu high-temperature superconductors, and compound semiconductors such as GaAs semiconductors; a device therefor; a FTIR gas analyzer (a gas analyzer based on Fourier transform infrared spectrometry) used in the thin film deposition process; and a mixed gas supplying device used in the thin film deposition process.

2. Description of the Prior Art

In recent years, thin film deposition processes based on MOCVD (metal-organic chemical vapor deposition) have been used as a method for forming PZT ferroelectric thin films such as a PZT $[Pb(Zr, Ti)O_3]$ thin film. The method for forming a PZT ferroelectric thin film, using the MOCVD, comprises the steps of sending inert gas such as argon gas as carrier gas into raw material vaporizers containing as source materials, for example, organic metal materials $Pb(C_{11}H_{19}O_2)_2$, $Zr(t-OC_4H_9)_4$ and $Ti(i-OC_3H_7)_4$, respectively, (which comprise Pb, Zr and Ti, respectively, which are the main constituent elements of the PZT ferroelectric thin film), so as to produce three organic metal gases which contain Pb, Zr and Ti, respectively; mixing these organic metal gases in a gas mixing chamber; adding oxygen gas as an oxidizer thereto so as to produce a mixed organic metal gas; supplying the mixed gas into a reaction chamber whose temperature is kept to an appropriate value; and growing a thin film originating from this organic metal mixed gas on the surface of a substrate (for example, $Pt/SiO_2/Si$, or Pt/MgO) set up in the reaction chamber.

The composition of the PZT ferroelectric thin film formed by the MOCVD is required to be stoichiometric. The composition of thin films obtained by thin film deposition processes in the prior art is controlled as follows.

That is, the temperatures (heating temperature) of the raw material vaporizers are first set up for the respective organic metal materials, and the concentrations of the respective gases are examined from the vapor pressures of the respective organic metal materials at the set-up temperatures. The concentrations of the respective organic metal materials are decided so as to correspond to a stoichiometric composition. Thereafter, the temperatures of the raw material vaporizers are subjected to fine adjustment. In this state, the flow rates of the carrier gases for the respective organic metal materials are set up to a constant value, so as to produce three organic metal gases. In this way, a PZT ferroelectric thin film is formed on an appropriate substrate.

The composition of the PZT ferroelectric thin film is analyzed with an analyzer such as an energy dispersion type X-ray analyzer (EDX). On the basis of the results, the temperature of the raw material vaporizer containing the organic metal material comprising an insufficient element, and the flow rates of the respective carrier gases are again adjusted. A PZT ferroelectric thin film is again formed.

The composition of this thin film is analyzed in the same manner as above to check whether or not the thin film has a given stoichiometric composition. When the thin film does not have the given stoichiometric composition, the above-mentioned work is repeated.

As described above, in conventional thin film deposition processes, a thin film is formed and subsequently the composition of this thin film is analyzed. When the analyzed composition is not a given stoichiometric composition, the conditions for generating the organic metal gases are amended and the process is repeated. Therefore, a problem that a significant amount of time is required for obtaining a thin film having a given composition arises. By repeating the formation of a thin film, the organic metal materials are consumed and the evaporation amounts of the organic metal gases change so that the composition of the gases can be out of a desired stoichiometric composition. That is, a problem of reproducibility arises.

The above-mentioned problems also arise in not only processes for depositing a PZT ferroelectric thin film but also processes for depositing a thin film, for example, a PLZT ferroelectric thin film, a Cu high-temperature superconductor thin film, or a compound semiconductor thin film such as a GaAs semiconductor thin film, by chemical vapor growth using an organic metal as a raw material.

SUMMARY OF THE INVENTION

The present invention has been made in the light of the above-mentioned situations. An object thereof is to provide a thin film deposition process making it possible to form a thin film having a desired composition with good reproducibility and high efficiency; a device therefor; a FTIR gas analyzer used in the thin film deposition process; and a mixed gas supplying device used in the thin film deposition process.

To attain the above-mentioned object, the present invention can include a thin film deposition process comprising the steps of mixing a plurality of organic metal gases in a gas mixing chamber and supplying the mixed gas into a reaction chamber to deposit a thin film on a substrate set up in the reaction chamber, wherein the mixture ratio between/among the organic metal gases supplied into the gas mixing chamber is measured with a FTIR gas analyzer fitted to the gas mixing chamber and then on the basis of results of the measurement the flow rates of the organic metal gases are individually adjusted The present invention further includes a thin film deposition process comprising the steps of mixing a plurality of organic metal gases in a gas mixing chamber and supplying the mixed gas into a reaction chamber to deposit a thin film on a substrate set up in the reaction chamber, wherein the mixture ratio between/among the organic metal gases supplied into the gas mixing chamber is measured with a FTIR gas analyzer fitted to the reaction chamber and then on the basis of results of the measurement the flow rates of the organic metal gases are individually adjusted.

The present invention provides a thin film deposition device comprising a gas mixing chamber for mixing a plurality of organic metal gases and a reaction chamber for depositing a thin film on a substrate, arranged at the downstream side of the gas mixing chamber, wherein a FTIR gas analyzer for measuring the mixture ratio between/among the organic metal gases is fitted to the gas mixing chamber and the flow rates of the organic metal gases are individually adjusted on the basis of results of measurement with the FTIR gas analyzer In all of the above-mentioned inventions, the mixture state (mixture ratio and concentration) of the plurality of organic metal gases used for forming the thin film can be directly monitored, which is different from the prior art. Therefore, the composition of the thin film can be more accurately analyzed in a shorter time. As a result, thin films having a desired composition can be produced with high reproducibility and efficiency.

In the invention, the mixture state of the plurality of organic metal gases is analyzed in the gas mixing chamber to which the organic metal gases are supplied, which is different from the case that the organic metal gases are individually analyzed; therefore, in the case that the organic metal gases react with each other to produce intermediates and multimers, the state of the mixed organic metal gas supplied to the reaction chamber can be analyzed by monitoring the intermediates and multimers. In this way, the composition of the thin film formed by the deposition can be accurately and easily controlled since the state of the gases supplied in-line can be determined. In other words, thin films having a pre-determined stored target composition can be obtained with high reproducibility since the temperatures of raw material vaporizers, the flow rates of carrier gases, and the temperature at the time of mixing the gases can be controlled depending on the concentrations (state) of gases to match the stored target composition.

The mixture state of the plurality of organic metal gases is analyzed in the reaction chamber to which mixed gas of the organic metal gases is supplied. The state of the gas can be monitored under conditions nearer to actually film-deposition conditions. Depending on the pressure inside the reaction chamber or the temperature of the substrate, the organic metal gases may decompose in the gas phase and solid contents produced at this time are deposited in the thin film so that the quality of the film may deteriorate remarkably.

The present invention includes a thin film deposition process comprising the steps of mixing a plurality of organic metal gases in a gas mixing chamber and supplying the mixed gas into a reaction chamber to deposit a thin film on a substrate set up in the reaction chamber, wherein an infrared light source and an interferometer are arranged at one side of the gas mixing chamber and an infrared detector for detecting infrared beam transmitted through the gas mixing chamber is arranged at the other side of the gas mixing chamber to measure the mixture ratio between/among the organic metal gases introduced to the gas mixing chamber.

The present invention can also include a thin film deposition process comprising the steps of mixing a plurality of organic metal gases in a gas mixing chamber and supplying the mixed gas into a reaction chamber to deposit a thin film on a substrate set up in the reaction chamber, wherein an infrared light source and an interferometer are arranged at one side of the reaction chamber and an infrared detector for detecting infrared beam transmitted through the reaction chamber is arranged at the other side of the reaction chamber to measure the mixture ratio between/among the organic metal gases introduced to the reaction chamber.

The mixture state of the organic metal gases can be measured with a single FTIR gas analyzer.

The present invention can further include a mixed gas supplying device used in a thin film deposition process comprising the steps of mixing a plurality of organic metal gases in a gas mixing chamber and supplying the mixed gas into a reaction chamber to deposit a thin film on a substrate set up in the reaction chamber, wherein a control signal based on a result of the mixture ratio between/among the organic metal gases, which is measured with a FTIR gas analyzer fitted to either the gas mixing chamber or the reaction chamber, is transferred to raw material vaporizers for generating the organic metal gases individually, so as to adjust the flow rates of the organic metal gases individually.

The organic metal gases used for forming the thin film can be generated at respective given flow rates. As a result, thin films having a given composition can be formed with high reproducibility.

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the general principles of the present invention have been defined herein to specifically provide a thin film deposition process and device with measurements of the depositing gases made in either the gas mixing chamber or the reaction chamber.

Figure 1:
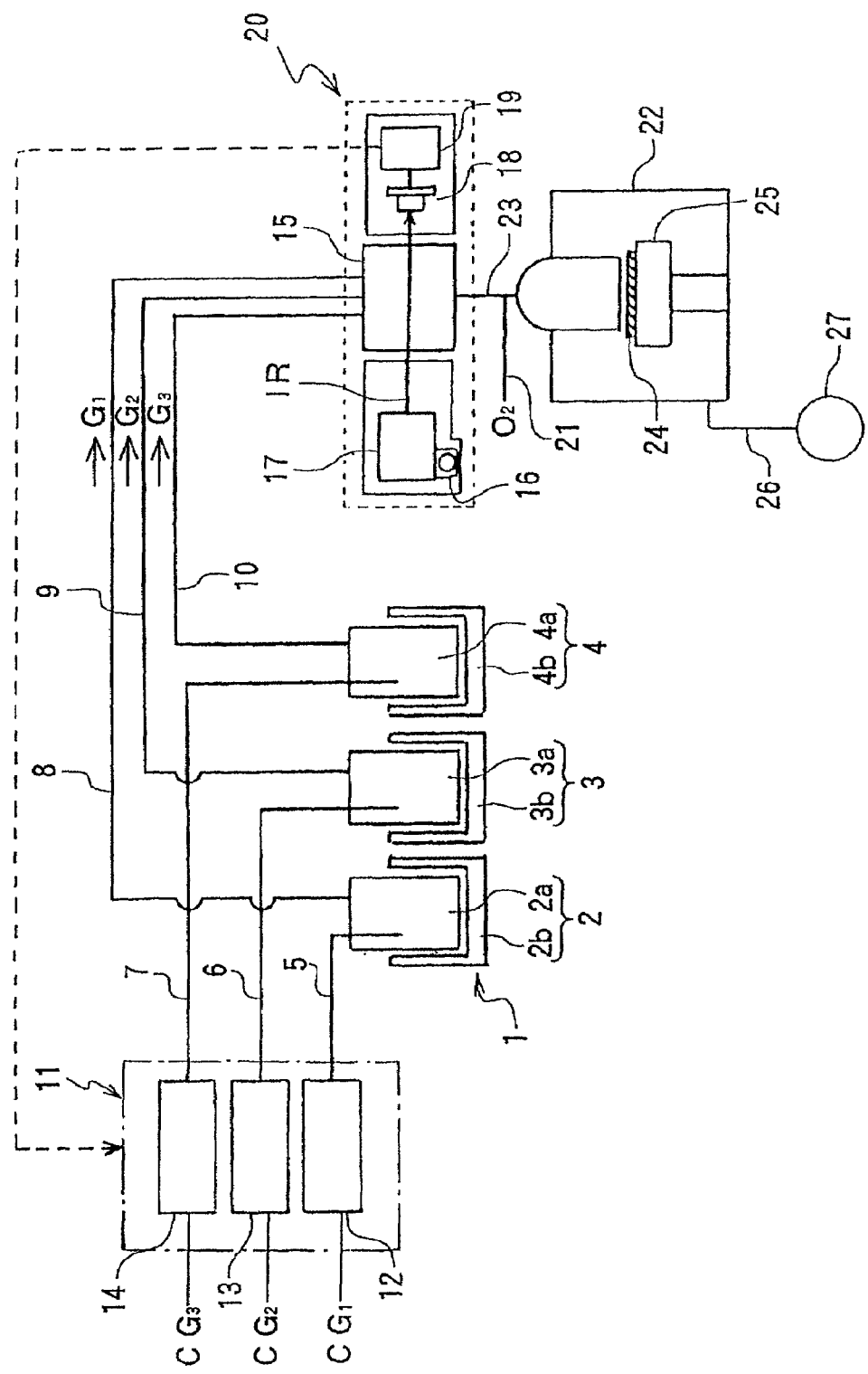
FIG. 1 is a schematic view of one example of the thin film deposition device of the present invention.

Referring to the drawings, embodiments of the present invention will be described. FIGS. 1-6 are related to a first embodiment of the present invention. FIG. 1 is a schematic view of one example of a thin film deposition device (MOCVD device) for carrying out the thin film deposition process of the present invention. This device is, for example, a device for forming a PZT ferroelectric, thin film. As illustrated in FIG. 1, a raw material vaporizing unit 1 has three raw material vaporizers 2-4. The raw material vaporizers 2-4 have containers $2a$-$4a$, respectively, containing organic metal materials $Pb(C_{11}H_{19}O_2)_2$, $Zr(t\text{-}OC_4H_9)_4$ and $Ti(i\text{-}OC_3H_7)_4$, respectively, (which comprise Pb, Zr and Ti, respectively, which are main constituent elements of the PZT ferroelectric thin film); and thermostats $2b$-$4b$ for raising or keeping the temperatures of the containers $2a$-$4a$ to appropriate temperatures. The temperatures of the thermostats $2b$-$4b$ can be set or controlled independently from each other, and the containers can be located as known in the art.

The containers $2a$-$4a$ have carrier gas passages 5-7 for introducing carrier gases $CG_1$, $CG_2$ and $CG_3$ (each of which is, for example, argon gas), respectively; and generated gas passages 8-10 for discharging organic metal gases $G_1$, $G_2$ and $G_3$ which are generated by evaporation of the organic metal materials in the raw material vaporizers 2-4 and which contain Pb, Zr and Ti, respectively, and forwarding the gases $G_1$, $G_2$ and $G_3$ to respectively a gas mixing chamber (described later).

Reference number 11 indicates a control unit for controlling the flow rates of the carrier gases, arranged at the upstream side of the carrier gas passages 5-7. The control unit 11 includes three mass flow controllers 12-14 arranged correspondingly to the respective carrier gas passages 5-7. Each of the mass controllers 12-14 is not specifically illustrated, and is composed of a gas flow rate sensor unit and a gas flow rate control valve to measure the flow rate of the actually-flowing gas (argon gas in the present embodiment) and control the gas flow rates in a manner that the measured flow rates become equal to set-up values given from the outside. The control unit can include a microcomputer with a memory and a processing program. The operator can set pre-determined parameters of the thin films to be deposited in the memory and comparisons can be made with the measured values, by the processing program with subsequent adjustment in the metal gases to remove any differences in the comparison results. Argon gas cylinders (not illustrated) are connected to the carrier gas passages 5-7 at the upstream side to the mass flow controllers 12-14.

Reference number 15 indicates a gas mixing chamber arranged at the downstream side of the carrier gas passages 5-7. The forwarded organic metal gases $G_1$, $G_2$ and $G_3$ together with the forwarded carrier gases $CG_1$, $CG_2$ and $CG_3$ are supplied to the gas mixing chamber 15, and then these organic metal gases $G_1$, $G_2$ and $G_3$ are mixed therein. This gas mixing chamber 15 is made in a manner that the temperature of the chamber 15 is appropriately raised or kept with a non-illustrated heater.

Non-illustrated windows made of an infrared beam transmissible material are made in opposite side walls of the gas mixing chamber 15. An infrared light source 16 and an interferometer 17 are set up outside one of the windows so that infrared beam IR can be radiated into the gas mixing chamber 15. An infrared detector 18 such as a semiconductor detector and an arithmetic and control unit 19 for calculating the concentration of a target component to be measured by processing outputs from the detector 18 appropriately are set up outside of the other window. The detector 18 detects the infrared beam IR which have been transmitted through the gas mixing chamber 15.

In this case, the gas mixing chamber 15 functions as a gas cell into which the organic metal gases $G_1$, $G_2$ and $G_3$ are supplied as sample gases. Therefore, in the thin film deposition device of the present embodiment, a gas analyzer 20 based on Fourier transform infrared spectrometry (referred as a FTIR gas analyzer in the specification) is fitted to the gas mixing chamber 15. Accordingly, the infrared beam IR is radiated to the gases supplied to the gas mixing chamber 15 through the interferometer 17. Typically, infrared detector output is accumulated and averaged, and is subjected to Fourier transformation. On the basis of the output subjected to Fourier transformation, a spectrum operation is made about the target component. In this way, the concentration and so on of the specified component contained in the gas can be measured on the basis of the absorption spectrum of the component.

The arithmetic and control unit 19 has a function of calculating the concentration, and also has a function of sending temperature control signals to a temperature control unit (not shown) of the raw material vaporizers 2-4 on the basis of the results of the calculation, and sending control signals to the three mass flow controller 12-14 of the carrier gas flow rate control unit 11. As noted, the mixture state of the organic gases can be directly measured even if multimers or intermediate products are formed and pre-stored values can be compared to enable a control of processing parameters such as heat, flow rates, etc. to adjust for the proper depositions of the film deposition.

Reference number 21 indicates an oxygen introducing passage for adding oxygen gas as an oxidizer to the mixed organic metal gas (obtained by mixing the three organic metal gases) from the gas mixing chamber 15. The passage 21 is connected to a gas supply passage 23 between the gas mixing chamber 15 and a reaction chamber 22 described in the following.

Reference number 22 indicates the reaction chamber arranged at the downstream side of the gas mixing chamber 15. The reaction chamber 22 is adjusted so that the inside thereof has an appropriate temperature and an appropriate pressure. Moreover, the chamber 22 has therein a substrate holder 25 on which a substrate 24 on which a PZT ferroelectric thin film is to be deposited is placed. The substrate holder 25 can heat the substrate 24 to a given temperature. An exhaust passage 26 connected to the reaction chamber 22 has a suction pump 27.

Non-illustrated open/shut off valves, that can be automatically controlled, are appropriately fitted to the carrier gas passages 5-7, the generated gas passages 8-10, the oxygen gas introducing passage 21, the gas supply passage 23 and the exhaust passage 26 so that these passages can be appropriately opened or shut off.

In order to form a PZT ferroelectric thin film on the substrate 24 in the thin film deposition device having the above-mentioned structure, for example, the following conditions were set. That is, the temperatures of the raw material vaporizers 2-4 containing organic metal materials $Pb(C_{11}H_{19}O_2)_2$, $Zr(t-OC_4H_9)_4$ and $Ti(i-OC_3H_7)_4$, respectively were set to 130° C., 30° C. and 35° C., respectively. The flow rates of the carrier gases $CG_1$, $CG_2$ and $CG_3$ supplied to the respective raw material vaporizers 2-4 were set to 100 mL/min., 50 mL/min. and 50 mL/min., respectively. The pressure of the reaction chamber 22 and the temperature of the substrate 24 were set to 667 Pa and 600° C., respectively.

The suction pump 27 is operated. In the three raw material vaporizers 2-4, the organic metals materials, i.e., $Pb(C_{11}H_{19}O_2)_2$, $Zr(t-OC_4H_9)_4$ and $Ti(i-OC_3H_7)_4$ are heated to given temperatures, respectively, and vaporized so as to generate the organic metal gases $G_1$, $G_2$ and $G_3$ containing Pb, Zr and Ti, respectively.

In this state, the mass flow controllers 12-14 are controlled to open the valves fitted thereto, so that the carrier gases $CG_1$, $CG_2$ and $CG_3$ are supplied to the raw material vaporizers 2-4. The organic metal gases $G_1$, $G_2$ and $G_3$ inside the raw material vaporizers 2-4 are discharged with the carrier gases $CG_1$, $CG_2$ and $CG_3$ to the generated gas passages 8-10, and then introduced into the gas mixing chamber 15 so that a mixed organic metal gas is prepared. Before the mixed organic metal gas is put in the gas mixing chamber 22, oxygen gas is added to this gas. The two gases are put into the gas mixing chamber 22. In the gas mixing chamber 22, the substrate 24 is beforehand heated to an appropriate temperature. Elements from the mixed organic metal gas are deposited on the substrate 24 in the presence of the oxygen gas to form a PZT thin film. The process up to the present stage is the same as in any thin film deposition device of this type in the prior art. In the present embodiment, the FTIR gas analyzer is fitted to the gas mixing chamber 15. As described above, therefore, it is possible to monitor the state of the organic metal gases $G_1$, $G_2$ and $G_3$ at the stage before they are supplied to the gas mixing chamber 22 or the state that these gases are mixed with the FTIR gas analyzer 20. This will be described hereinafter.

Figure 2:
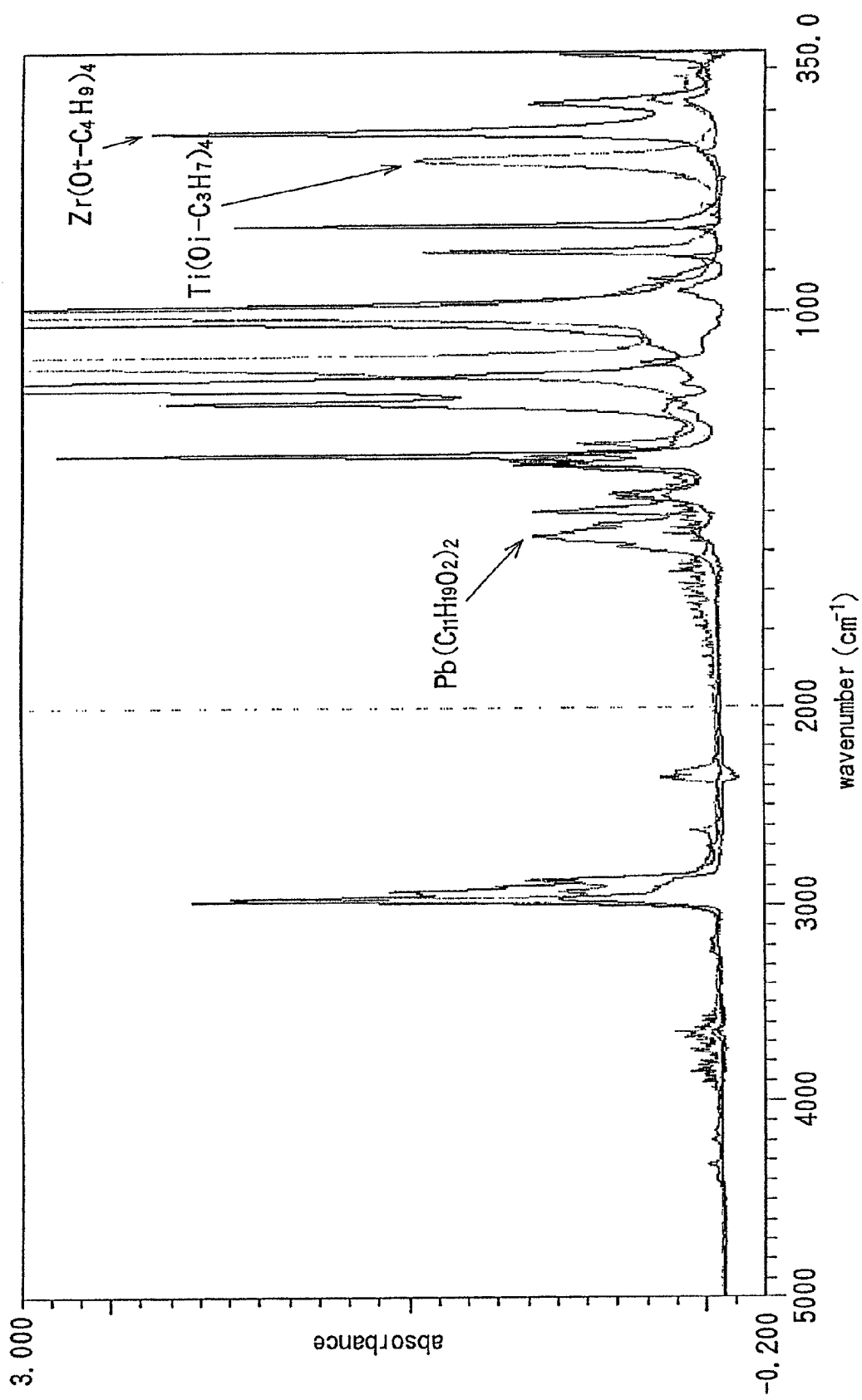
FIG. 2 shows one example of spectra obtained when organic metal gases were separately introduced in a gas mixing chamber.

FIG. 2 shows results measured with the FTIR gas analyzer 20 when the organic metal gases $G_1$ [originating from the evaporation of $Pb(C_{11}H_{19}O_2)_2$], $G_2$ [originating from the evaporation of $Zr(t-OC_4H_9)_4$] and $G_3$ [originating from the evaporation of Ti(i-OC$_3$H$_7$)$_4$] were separately introduced into the gas mixing chamber 15. From these spectra, it can he understood that the absorption spectrum of each of the organic metal gases G$_1$, G$_2$ and G$_3$ has a characteristically separated peak. Therefore, from the value of the peak of the absorption spectrum, each of these gases can be quantitatively-supplied to the gas mixing chamber 15.

Figure 3:
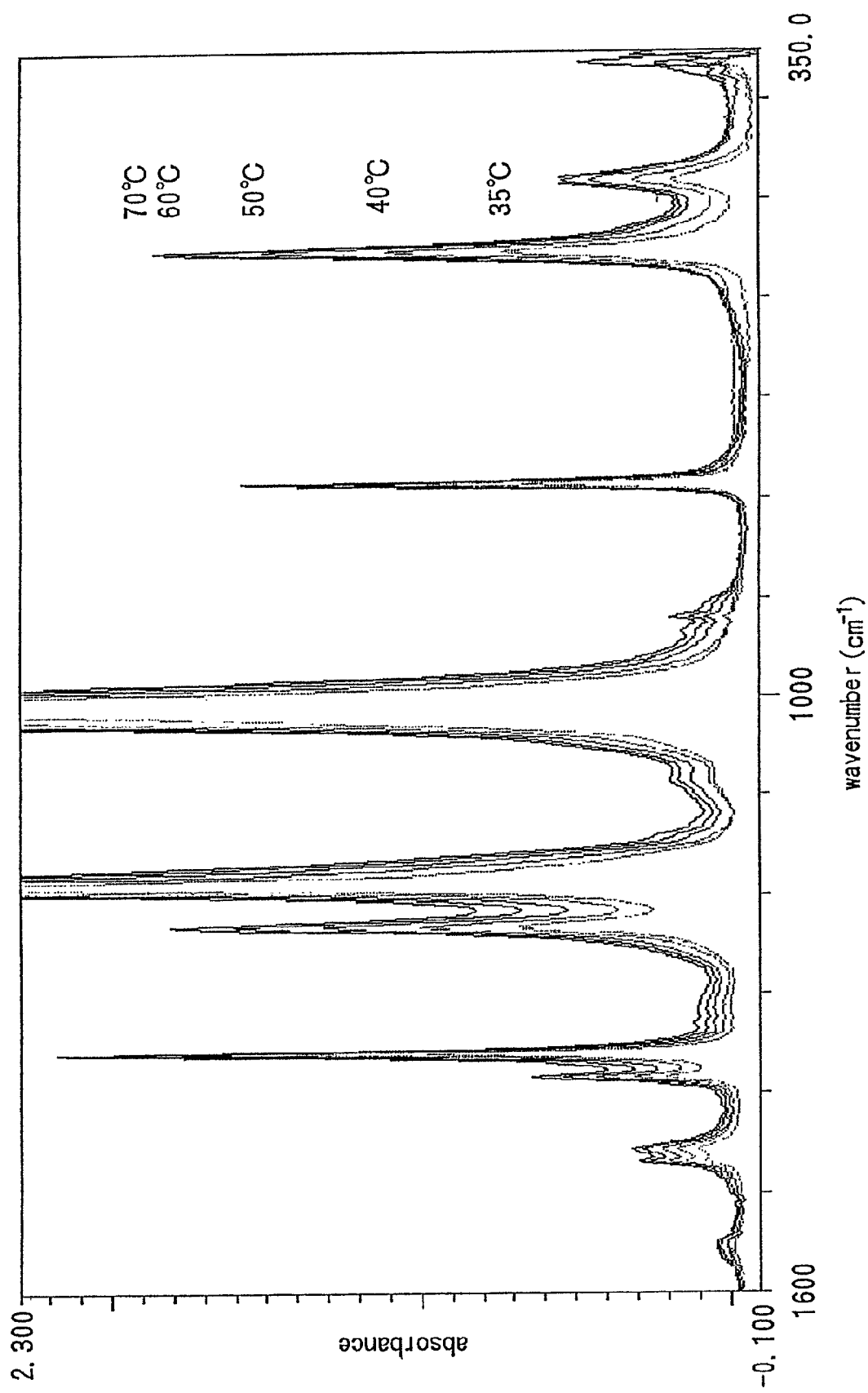
FIG. 3 shows one example of spectra obtained when the inner temperature of the gas mixing chamber was changed.

FIG. 3 shows results measured with the FTIR gas analyzer 20 when the temperature of the raw material vaporizer 3 for generating, for example, the organic metal gas G$_2$ was gradually raised. This graph demonstrates that as the temperature of this vaporizer 3 is raised, the concentration of the gas becomes higher and the peak strength of the spectrum becomes larger. Therefore, it can be understood that the concentration of the gas can be monitored with the FTIR gas analyzer 20. In the case that the introduced amounts of the carrier gases CG$_1$, CG$_2$ and CG$_3$ were increased while the temperature of the raw material vaporizer 3 was kept to a given constant value, substantially the same results were obtained.

As described above, in the present embodiment, the organic metal gases G$_1$, G$_2$ and G$_3$, which are raw materials of a PZT ferroelectric thin film, can be separately monitored. Therefore, the mixed organic metal gas can be stably supplied to the reaction chamber 22 so that a PZT ferroelectric thin film having a stoichiometric composition can be deposited. This is because even if the amounts of the organic metal gas G$_1$, G$_2$ and G$_3$ change in the middle of the film-deposition, the mixed organic metal can be stably supplied by feeding back control signals to the raw material vaporizer 1 or the control unit 11 for controlling the carrier gas flow rates on the basis of the results measured with the FTIR gas analyzer 20 and adjusting the heating or retaining temperature of the raw material vaporizer 2-4 or the flow rates based on the mass flow controllers 12-14 individually.

Figure 4:
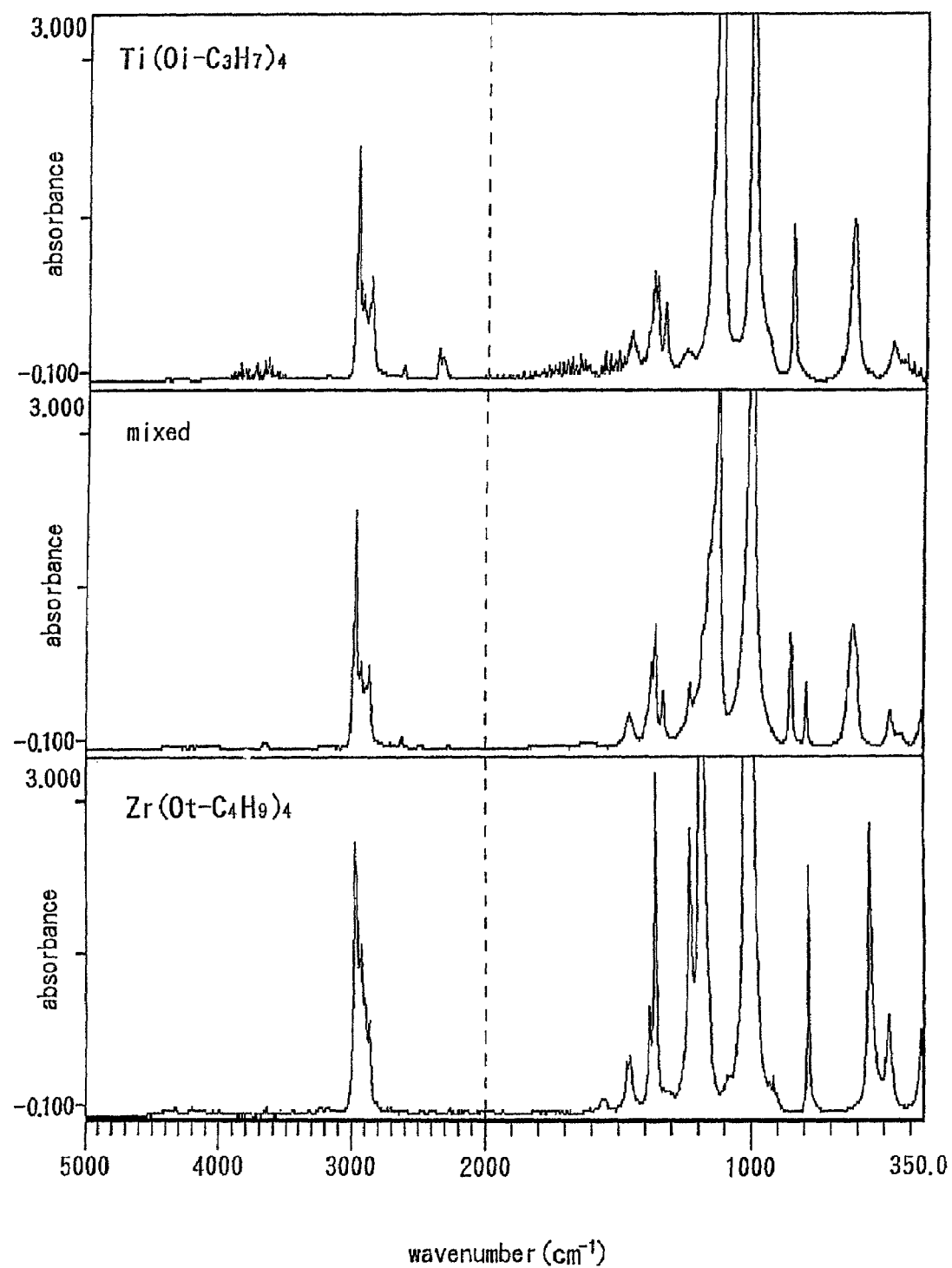
FIG. 4 shows one example of spectra obtained when two organic metal gases were introduced in the gas mixing chamber.

FIG. 4 shows results measured with the FTIR gas analyzer 20 in the case that the organic metal gases G$_2$ [originating from Zr(t-OC$_4$H$_9$)$_4$] and G$_3$ [originating from Ti(i-OC$_3$H$_7$)$_4$] were simultaneously introduced into the gas mixing chamber 15 while the temperature inside the gas mixing chamber 15 was kept to 70° C. In FIG. 4, the upper and lower graphs show the spectrum of only the organic metal gas G$_2$ and that of only the organic metal gas C$_3$, respectively. The middle graph shows the spectrum of the mixed G$_2$ and G$_3$. The middle spectrum is different from the spectrum obtained by introducing only the organic metal gas G$_2$ to the gas mixing chamber 15 and the spectrum obtained by introducing only the organic metal gas G$_3$ thereto. That is, in the middle spectrum, peaks were lost or shifted from the upper and lower spectra, and new peaks were generated. This fact can be more clearly understood from FIG. 5, which is an enlarged view of a part (1600-350 cm$^{-1}$) of the wavenumber range shown in FIG. 4.

Figure 5:
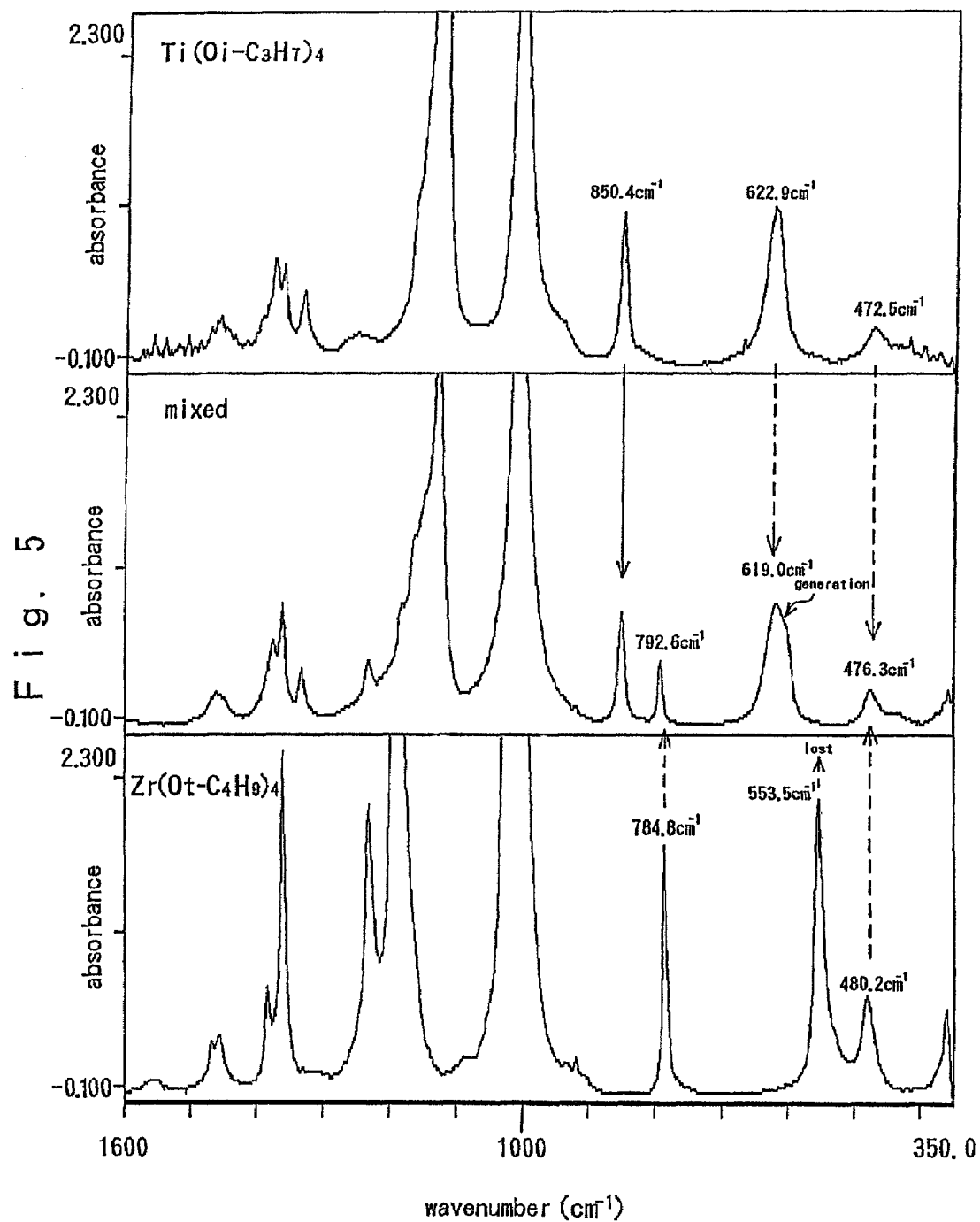
FIG. 5 is an enlarged view of a part of the spectra shown in FIG. 4.

As illustrated in FIGS. 4 and 5, the reason of the lost or shift of the peaks and new generation of the peaks is that the two organic metal gases G$_2$ and G$_3$ reacted with each other in the gas mixing chamber 15 to produce multimers or intermediates.

Figure 6:
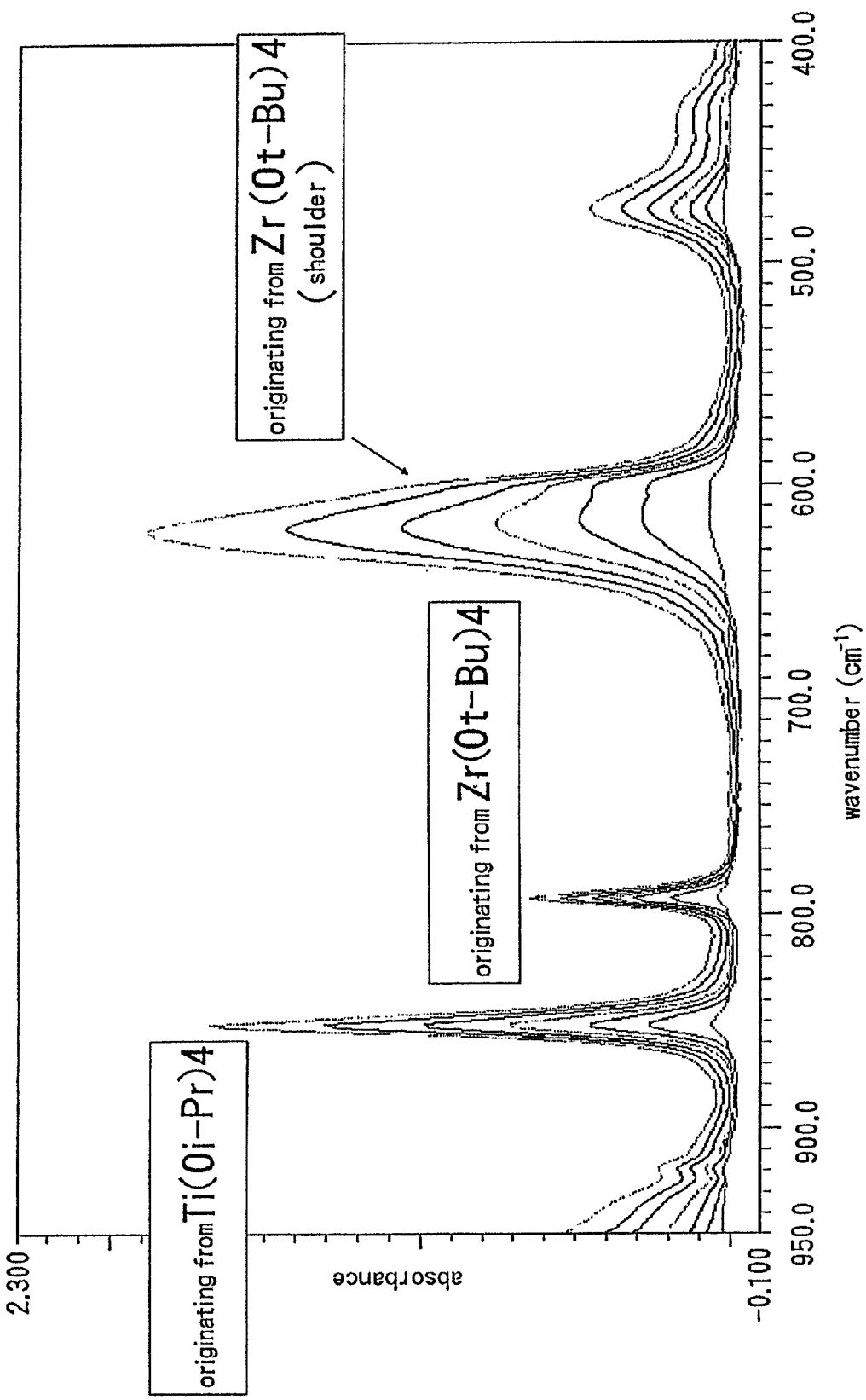
FIG. 6 shows one example of spectra obtained when the temperature of the gas mixing chamber was raised in the case that two organic metal gases were simultaneously introduced in the gas mixing chamber.

FIG. 6 shows results measured with the FTIR gas analyzer 20 in the case that the temperature of the gas mixing chamber 15 was gradually raised when the organic metal gases G$_2$ and G$_3$ were simultaneously introduced to the gas mixing chamber 15. From this graph, it can be understood that if the temperature rises at the time of mixing the organic metal gases G$_2$ and G$_3$, the generated amounts of the multimers and the intermediates change.

As described above, the present embodiment makes it possible to monitor the mixture state of the organic metals gases (G$_2$ and G$_3$ in the present embodiment) which are raw materials of a PZT ferroelectric thin film with the FTIR gas analyzer 20 fitted to the gas mixing chamber 15. Since the multimers and the intermediates originating from the mixing can be monitored, the mixed organic metal gas can be stably supplied to the reaction chamber 22. As a result, a PZT thin film having a stoichiometric composition can be deposited. This is because even if the amounts of the organic metal gas G$_1$, G$_2$ and G$_3$ change in the middle of the film-deposition, the mixed organic metal can be stably supplied by feed back control signals to the raw material vaporizer 1, the control unit 11 for controlling the carrier gas flow rates or gas mixing chamber 15 on the basis of the results measured with the FTIR gas analyzer 20 and adjusting the heating or retaining temperature of the raw material vaporizer 2-4 or the flow rates based on the mass flow controllers 12-14 individually.

In the first embodiment, the organic metal gases G$_1$, G$_2$ and G$_3$ used in the formation of the PZT ferroelectric thin film are introduced and the FTIR gas analyzer 20 is fitted to the gas mixing chamber 15 for mixing these gases. Therefore, the mixture state (mixture ratio and concentration) of the organic metal gases G$_1$, G$_2$ and G$_3$ can be directly monitored. Accordingly, the composition of the thin film can be accurately analyzed in a short time period. On the basis of the results measured with the FTIR gas analyzer 20, the quantities to be controlled about the respective parts of the device (for example, the flow rates of the carrier gases GC, the heating or retaining temperature of the raw material vaporizer 2-4 or the temperature at the time of the mixing) can be individually adjusted. Therefore, PZT ferroelectric thin films having a desired composition can be formed with high reproducibility and efficiency.

That is, in the above-mentioned embodiment, the mixture state of the plurality of organic metal gases G$_1$, G$_2$ and G$_3$ is analyzed in the gas mixing chamber 15 to which the organic metal gases G$_1$, G$_2$ and G$_3$ are supplied; therefore, in the case that the organic metal gases G$_1$, G$_2$ and G$_3$ react with each other to produce intermediates and multimers, the state of the mixed organic metal gas supplied to the reaction chamber 22 can be analyzed by monitoring the intermediates and multimers. This process is different from the case that the organic metal gases G$_1$, G$_2$ and G$_3$ are individually analyzed. In the present embodiment, the composition of the PZT ferroelectric thin film formed by the deposition can be accurately and easily controlled since the state of the gas supplied in-line can be monitored. In other words, PZT ferroelectric thin films having a target composition can be obtained with high reproducibility since the temperatures of the raw material vaporizers 2-4, the flow rates of the carrier gases CG$_1$, CG$_2$ and CG$_3$, and the temperature at the time of mixing the gases can be controlled.

In the above-mentioned first embodiment, the FTIR gas analyzer 20 is fitted to the gas mixing chamber 15 to which the plurality of organic metal gases G$_1$, G$_2$ and G$_3$ are supplied. Therefore, the reaction of the gases G$_1$, G$_2$ and G$_3$ can be easily analyzed and the composition of PZT ferroelectric thin films can be easily controlled.

In the first embodiment, the mixture state of the plurality of organic metal gases G$_1$, G$_2$ and G$_3$ can be analyzed only by fitting the single FTIR gas analyzer 20 to the gas mixing chamber 15.

In the first embodiment, the plurality of organic metal gases G$_1$, G$_2$ and G$_3$ used for forming PZT ferroelectric thin films can be generated at respective given flow rates. Thus, the first embodiment is suitable for forming PZT ferroelectric thin films having a desired composition with high reproducibility.

Figure 7:
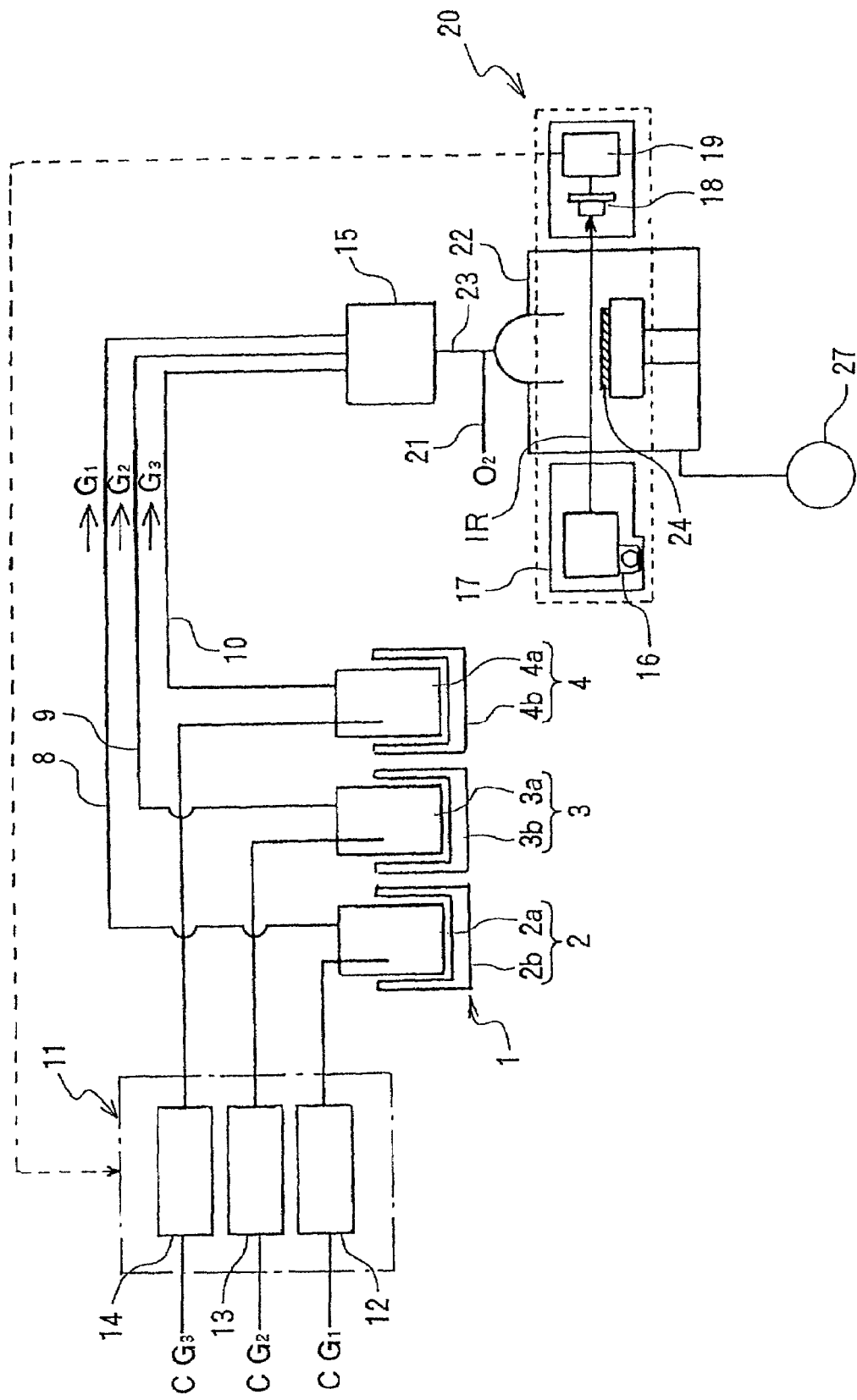
FIG. 7 is a schematic view of another example of the thin film deposition device of the present invention.

In the first embodiment, the FTIR gas analyzer 20 for analyzing the mixture state of the plurality of organic metal gases $G_1$, $G_2$ and $G_3$ is fitted to the gas mixing chamber 15. However, the present invention is not limited to such an arrangement. As illustrated in FIG. 7, a FTIR gas analyzer 20 may be fitted to a reaction chamber 22.

In the present second embodiment, windows (not shown) that are made of an infrared beam transmissible material are made in opposite side walls of the reaction chamber 22. An infrared light source 16 and an interferometer 17 are set up outside one of the windows so that infrared beam IR can be radiated into the reaction chamber 22. An infrared detector 18 such as a semiconductor detector and an arithmetic and control unit 19 for calculating the concentration of a target component to be measured by processing outputs from the detector 18 appropriately are set up outside of the other window. The detector 18 detects the infrared beam 18 which has been transmitted through the reaction chamber 22. Thus, the state of the mixed organic metal gas in the reaction chamber 22 can be monitored In the thin film deposition device according to the second embodiment, a PZT ferroelectric thin film can be formed in the same way as in the thin film deposition device according to the first embodiment. In the second embodiment, the mixture state of the organic metal gases $G_1$, $G_2$ and $G_3$ is analyzed in the reaction chamber to which the mixed gas of the organic metal gases $G_1$, $G_2$ and $G_3$ is supplied. Therefore, the same effects and advantages as in the first embodiment can be obtained. Besides, the state of the gas can be monitored under conditions nearer to actually film-deposition conditions. Incidentally, dependent on the pressure inside the reaction chamber 22 or the temperature of the substrate 24, the organic metal gases $G_1$, $G_2$ and $G_3$ may decompose in the gas phase and solid contents produced at this time are taken in the thin film so that the quality of the film may deteriorate remarkably. According to the second embodiment, reaction of the production in the gas phase can be monitored.

In both of the above-mentioned embodiments, the arithmetic and control unit 19 is arranged in the FTIR gas analyzer 20. However, the arithmetic and control unit 19 may be arranged outside the FTIR gas analyzer 20.

The present invention can be used not only for forming PZT ferroelectric thin films but also for forming various thin films, for example, thin films to be formed by chemical vapor deposition using, for example, PLZT ferroelectries, BaSr ferroelectrics, Cu high-temperature superconductor, and compound semiconductors such as GaAs semiconductors as raw materials.

According to the present invention, the mixture state (mixture ratio and concentration) of a plurality of organic metal gases used for forming a thin film can be directly monitored, which is different from the prior art. Therefore, the composition of the thin film can be more accurately analyzed for a shorter time. As a result, thin films having a desired composition can be produced with high reproducibility and efficiency.

What is claimed is:

1. A thin film depositing device comprising:
    a plurality of organic metal gas sources, each organic metal gas source providing a supply of organic metal gas at a selected flow rate, each organic metal gas being carried on a carrier gas;
    a gas mixing chamber connected to the plurality of organic metal gas sources and mixing a plurality of separately introduced organic metal gases into a mixture state;
    a reaction chamber receiving the mixture of organic metal gases from the gas mixing chamber and depositing a thin film having a predetermined composition on a substrate, the predetermined composition being determined from the mixture state of the plurality of organic metal gases;
    a FTIR gas analyzer connected to the gas mixing chamber and directly measuring the mixture state of the organic metal gases within the gas mixing chamber including measuring reactant intermediates and multimers of the plurality of organic metal gases and producing a measurement result; and
    a control unit receiving the measurement results and individually adjusting the flow rate of each supply of organic metal gas, the control unit having a memory for storing predetermined mixture state parameters of the thin film to be deposited, the control unit for comparing the measurement result with the predetermined mixture state parameters and individually adjusting the flow rates to remove differences between the measurement result and the mixture state parameters.

2. A mixed gas supplying device used in a thin film depositing process including the steps of mixing a plurality of separately introduced organic metal gases and supplying the mixed gas into a reaction chamber to deposit a thin film on a substrate set up in the reaction chamber, comprising:
    a gas mixing chamber receiving a plurality of separately introduced organic metal gases and mixing the organic metal gases into a mixture state;
    a FTIR gas analyzer operatively connected to the gas mixing chamber to measure the mixture state of the plurality of organic metal gases;
    a plurality of vaporizer units respectively vaporizing organic metal gases; and
    a control unit connected to the FTIR analyzer and the plurality of vaporizer units to provide a control output based on a result of the mixture state of the organic metal gases to control the flow ratio of the organic metal gases individually from the respective vaporizer units to the gas mixing chamber.

3. The thin film depositing device of claim 2 further including a memory unit storing pre-determined values of multimers and intermediate products representative of the mixed gas.

4. A thin film depositing device for depositing thin films on a substrate comprising:
    means for mixing a plurality of separately introduced organic metal gases including a gas mixing chamber into a mixture state;
    a reaction chamber for supporting a substrate;
    means for supplying the mixed gas to the reaction chamber to deposit a thin film on the substrate;
    means for measuring the mixture state of the organic metal gases supplied into the gas mixing chamber with a FTIR gas analyzer operatively connected to one of the gas mixing chamber and the reaction chamber for measuring the mixed organic metal gases; and
    means for adjusting, if necessary, the flow rates of the organic metal gases on the basis of results of the measurement of the mixed organic metal gases includes pre-stored mixture state parameters and means for comparing the measured mixture state with the pre-stored mixture state parameters and adjusting the flow rates of the organic metal gases when the measured state varies by a predetermined amount from the pre-stored mixture state parameters.

5. The thin film depositing device of claim 4 wherein the FTIR gas analyzer is fitted to the gas mixing chamber.

6. The thin film depositing device of claim 4 wherein the FTIR gas analyzer is fitted to the reaction chamber.

7. A thin film depositing system for metal-organic chemical vapor deposition comprising:
- a gas mixing chamber mixing a plurality of separately introduced organic metal gases in a gas mixture having a mixture state;
- a reaction chamber receiving the gas mixture from the mixing chamber and depositing a thin film on a substrate; and
- a FTIR gas analyzer measuring the mixture ratio between/among the organic metal gases and intermediate products and/or multimers generated from the mix of the plurality of organic metal gases is fitted to one of the gas mixing chamber and the reaction chamber; and
- a controller unit adjusting the flow rates of the separately introduced organic metal gases including a memory unit for storing pre-determined values of multimers and intermediate products representative of the mixed gas which are compared by the controller unit when adjusting the flow rates.

8. The thin film depositing system of claim 7 wherein the FTIR gas analyzer is fitted to the gas mixing chamber.

9. The thin film depositing system of claim 7 wherein the FTIR gas analyzer is fitted to the reaction chamber.

10. A thin film depositing device for depositing thin films on a substrate comprising:
- means for mixing a plurality of separately introduced organic metal gases including a gas mixing chamber, the separately introduced organic metal gases being mixed in a mixture state;
- a reaction chamber for supporting a substrate;
- means for supplying the mixed gas to the reaction chamber to deposit a thin film on the substrate;
- means for measuring the mixture state of the organic metal gases supplied into the gas mixing chamber and multimers and intermediate products representative of the mixed gas with a FTIR gas analyzer operatively connected to one of the gas mixing chamber and the reaction chamber; and
- means for adjusting, if necessary, the flow rates of the organic metal gases on the basis of results of the measurement.

11. The thin film depositing device of claim 10 further including a memory unit for storing pre-determined values of multimers and intermediate products representative of the mixed gas.

12. The thin film depositing device of claim 11 wherein the FTIR gas analyzer is fitted to the gas mixing chamber.

13. The thin film depositing device of claim 11 wherein the FTIR gas analyzer is fitted to the reaction chamber.

14. A thin film depositing device for metalorganic chemical vapor deposition comprising:
- a plurality of sources of organic metal gases;
- a gas mixing chamber mixing the separately introduced organic metal gases;
- flow control units controlling the flow of the separately introduced organic metal gases to the gas mixing chamber to produce a mixed gas having a mixture state;
- a reaction chamber depositing a thin film on a substrate connected to the gas mixing chamber;
- a FTIR gas analyzer measuring the mixture state of the organic metal gases and intermediate products and/or multimers generated from the mix of the plurality of separately introduced organic metal gases;
- a memory unit storing predetermined values representative of respectively the plurality of organic metal gases, intermediate products and multimers; and
- a controller operatively connected to the flow control units, FTIR gas analyzer and memory unit and comparing output signals from the FTIR gas analyzer with the stored predetermined values and adjusting, based on the comparison, the flow control units to regulate the mixture state of the plurality of organic metal gases in the gas mixing chamber.

15. The thin film depositing device of claim 14 further including a source of oxygen and means for regulating the flow of oxygen to the reaction chamber.

16. A depositing device for metal-organic chemical vapor deposition of PZT ferroelectric thin films comprising:
- a metal-organic source of $Pb(C_{11}H_{19}O_2)_2$;
- a metal-organic source of $Zr(t\text{-}OC_4H_9)_4$;
- a metal-organic source of $Ti(i\text{-}OC_3H_7)_4$;
- a source of a carrier gas;
- a vaporizer unit connected to the metal-organic sources and the carrier gas to provide organic metal gases;
- a gas mixing chamber connected to the vaporizer unit for mixing the separately introduced organic metal gases in gas mixture having a mixture state;
- flow control units controlling the flow of each of the separately introduced organic metal gases to the gas mixing chamber;
- a reaction chamber receiving the gas mixture from the gas mixing chamber and depositing a thin PZT film on a substrate;
- a FTIR gas analyzer measuring the mixture state of the organic metal gases and intermediate products and/or multimers generated from the mix of the plurality of separately introduced organic metal gases;
- a memory unit storing predetermined values representative of respectively the plurality of organic metal gases, intermediate products and multimers; and
- a controller operatively connected to the flow control units, FTIR gas analyzer and memory unit and comparing output signals from the FTIR gas analyzer with the stored predetermined values and adjusting, based on the comparison, the flow control units to regulate the mixture state of the plurality of organic metal gases.

17. The depositing device of claim 16 further including the vaporizer unit heating one or more of the metal-organic sources to a temperature of 30° C. to 35° C. and another metal organic source to a temperature of 130° C.

* * * * *